United States Patent [19]

Arai

[11] B 3,999,207
[45] Dec. 21, 1976

[54] FIELD EFFECT TRANSISTOR WITH A CARRIER INJECTING REGION

[75] Inventor: Michio Arai, Tokyo, Japan

[73] Assignee: Sony Corporation, Tokyo, Japan

[22] Filed: June 19, 1974

[21] Appl. No.: 480,749

[44] Published under the second Trial Voluntary Protest Program on March 9, 1976 as document No. B 480,749.

[30] Foreign Application Priority Data

Jan. 21, 1973 Japan ............................ 48-70120
June 21, 1973 Japan ............................ 48-70121

[52] U.S. Cl. .............................. 357/22; 357/38; 307/251; 307/304
[51] Int. Cl.² ...................................... H01L 29/80
[58] Field of Search ................. 357/22, 23, 38; 307/304, 251

[56] References Cited

UNITED STATES PATENTS

| | | | |
|---|---|---|---|
| 3,453,504 | 7/1969 | Compton et al. | 357/22 |
| 3,538,399 | 11/1970 | Bresee et al. | 357/22 |
| 3,595,715 | 7/1971 | Thire et al. | 357/22 |
| 3,597,287 | 8/1971 | Koepp | 357/22 |
| 3,619,737 | 11/1971 | Chiu | 357/22 |
| 3,649,385 | 3/1972 | Kobayashi | 357/22 |
| 3,656,031 | 4/1972 | Bresee et al. | 357/22 |
| 3,663,873 | 5/1972 | Yagi | 357/22 |
| 3,755,012 | 8/1973 | George et al. | 357/22 |

*Primary Examiner*—Andrew J. James
*Attorney, Agent, or Firm*—Hill, Gross, Simpson, Van Santen, Steadman, Chiara & Simpson

[57] ABSTRACT

A semiconductor device includes a first semiconductive region of one conductivity type, a first electrode and a second electrode formed on said first semiconductive region, a second semiconductive region of the opposite conductivity type contiguous to a current path portion extending between said first electrode and said second electrode and a third semiconductive region of said one conductivity type contiguous to said second conductive region. In the semiconductor device, a voltage is applied between said first semiconductive region and said third semiconductive region to control conditions of said second semiconductive region. Carriers are electrically injected into said second semiconductive region from said first semiconductive region and/or said third semiconductive region. The conditions of said second semiconductive region varies with the injection of the carriers and the varying conditions are detected.

3 Claims, 14 Drawing Figures

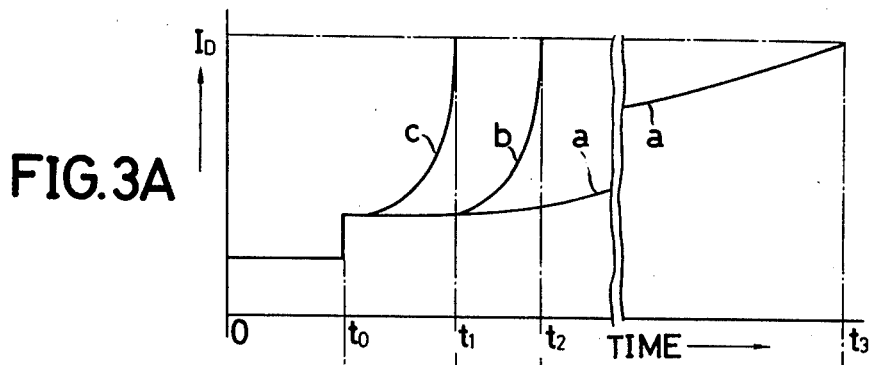
FIG.3A
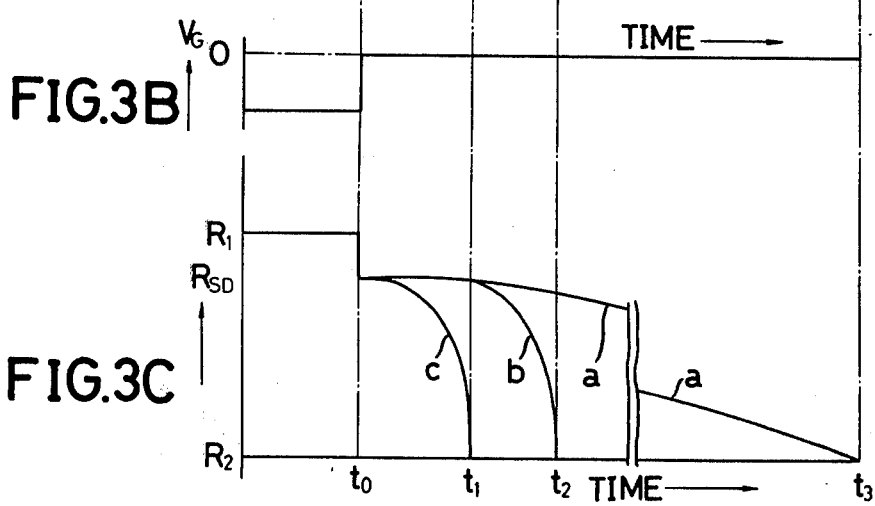
FIG.3B
FIG.3C
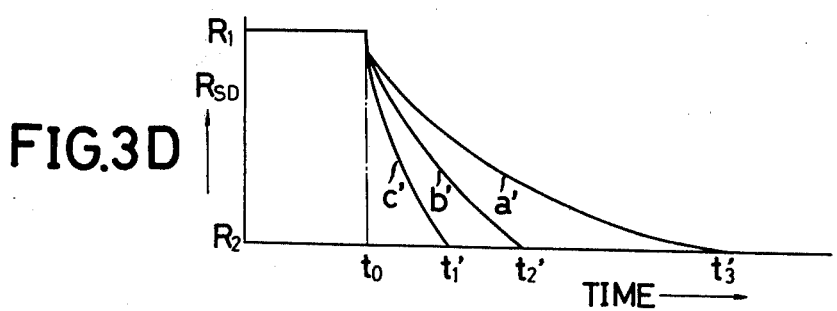
FIG.3D

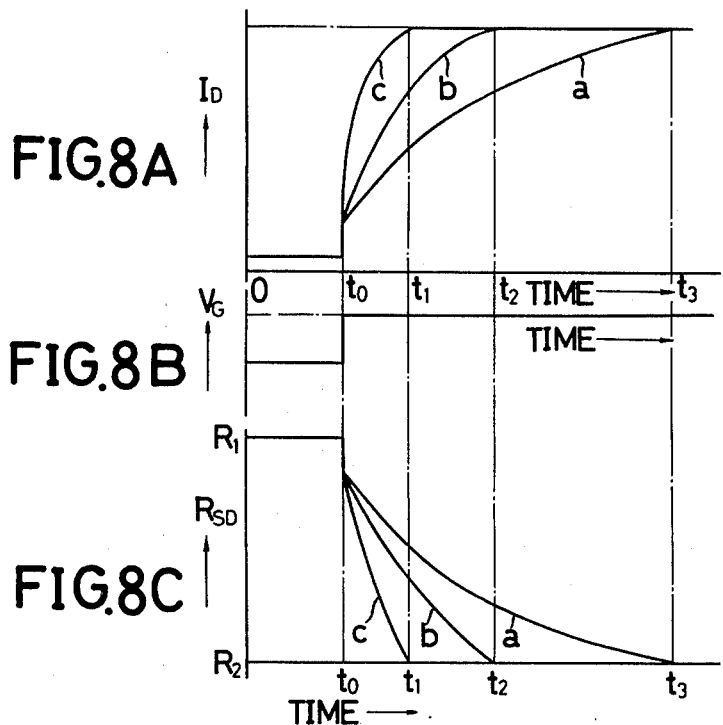
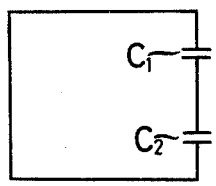
FIG.4
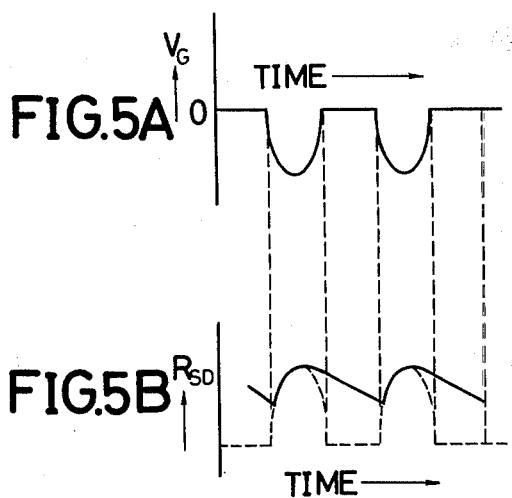

3,999,207

FIELD EFFECT TRANSISTOR WITH A CARRIER INJECTING REGION

BACKGROUND OF THE INVENTION

1. Field of the Invention

This invention relates to a semiconductor device, and more particularly to a semiconductor device in which applied signals can be stored.

2. Description of the Prior Art

The conventional junction type field effect transistor (J-FET) is applicable to a memory circuit or a waveshaping circuit. However, in order to form a time constant circuit, the conventional J- FET should be used in combination with a large capacity and/or resistance. It is complicated to manufacture the capacity and/or resistance formed integrally with the J-FET on a semiconductor substrate, and in such a case, the number of the J-FETs formed on a semiconductor substrate is small.

SUMMARY OF THE INVENTION

Accordingly, it is an object of this invention to provide a semiconductor device for constituting a time-constant circuit.

Another object of this invention is to provide a semiconductor device for constituting a time-constant circuit provided with a means to control a time-constant.

A further object of this invention is to provide a semiconductor device in which a quantity of charge stored in a current path portion can be rapidly changed and thereby a timeconstant can be easily and exactly defined.

A still further object of this invention is to provide a semiconductor device which is suitable for a switching element and a pulse responsing apparatus such as a peak voltmeter or a chattering preventing circuit.

In accordance with an aspect of this invention, a semiconductor device comprises a first semiconductive region of one conductivity type, a first electrode and a second electrode formed on the first semiconductive region, a second semiconductive region of the opposite conductivity type contiguous to a current path portion extending between the first electrode and the second electrode, a third semiconductive region of the one conductivity type contiguous to the second semiconductive region, a control means for supplying a voltage between the first semiconductive region and the third semiconductive region and controlling conditions of the second semiconductive region and a detecting means for detecting the conditions of the second semiconductive region, wherein carriers are electrically injected into the second semiconductive region from the first semiconductive region and/or the third semiconductive region.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 3A is a graph showing changes of drain currents in the FET of FIG. 1;

FIG. 3B is a graph showing a change of a gate voltage supplied to the FET of FIG. 1;

FIG. 3C and FIG. 3D are graphs showing changes of resistances between a source region and a drain region in the FET of FIG. 1;

FIG. 4 is an equivalent circuit diagram to PN-junctions of the FET of FIG. 1;

FIG. 5A is a graph showing a change of an AC gate voltage supplied to the FET of FIG. 1;

FIG. 5B is a graph showing changes of resistances between the source region and the drain region when the AC gate voltage is supplied to the FET of FIG. 1;

FIG. 8A is a graph showing changes of drain currents in the FET of FIG. 6.

FIG. 8B is a graph showing a change of a gate voltage supplied to the FET of FIG. 6 and FIG. 8C is a graph showing changes of resistances between a source region and a drain region in the FET of FIG. 6.

DESCRIPTION OF THE PREFERRED EMBODIMENTS

Figure 1:
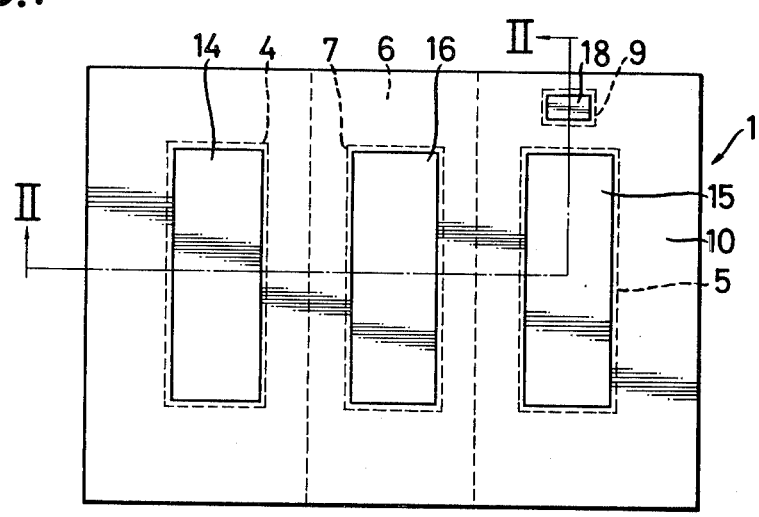
FIG. 1 is a plan view of a lateral charge storage junction type FET according to one embodiment of this invention.
Figure 2:
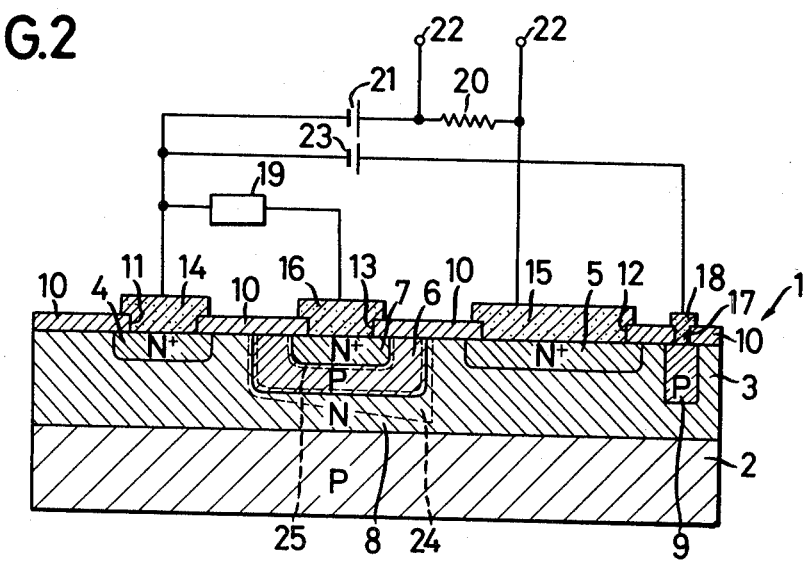
FIG. 2 is a cross sectional view taken along the line II–II of FIG. 1.

A lateral charge storage junction type FET 1 according to one embodiment of this invention will be described with reference to FIG. 1 and FIG. 2.

An N-type semiconductive region 3 is formed on a P-type semiconductive substrate 2 by the epitaxial growth method. An N$^+$-type semiconductive region 4 as a source region and another N$^+$-type semiconductive region 5 as a drain region are formed in the N-type semiconductive region 3 by the diffusion method, respectively. A P-type semiconductive region 6 as a gate region is formed in the N-type semiconductive region 3 between the N$^+$-type semiconductive regions 4 and 5, by the diffusion method. The conventional lateral junction type FET is constructed in the above-described manner.

According to one embodiment of this invention, an N$^+$-type semiconductive region 7 is formed in the P-type semiconductive region 6 by the diffusion method. A PN-junction is formed between the N$^+$-type semiconductive region 7 and the P-type semiconductive region 6. Between the P-type semiconductive substrate 2 and the P-type semiconductivee region 6, an N-type channel region 8 is formed. Moreover, a P-type semiconductive region 9 is formed in the N-type semiconductive region 3 adjacent to the N$^+$-type semiconductive region 5 by the diffusion method. The P-type semiconductive region 9 functions as an emitter region for injecting carriers.

An insulating layer 10 of SiO$_2$ is thermally grown or pyrolytically deposited on the N-type semiconductive region 3. Openings 11, 12 and 13 formed on the insulating layer 10 are closed by a source electrode 14, a drain electrode 15 and a gate electrode 16, respectively. Moreover, an opening 17 formed in the insulating layer 10 is closed by an emitter electrode 18.

In the charge storage junction type FET 1, a gate control circuit 19 is connected between the source electrode 14 and the gate electrode 16. A resistor 20 and a power source 21 are connected between the source electrode 14 and the drain electrode 15. Output terminals 22 are connected to both ends of the resistor 20. Moreover, another power source 23 is connected between the source electrode 14 and the emitter electrode 18.

Next, operations of the charge storage junction type FET 1 will be described.

A gate voltage $V_G$ is supplied between the source electrode 14 and the gate electrode 16 so that a negative potential is applied to the gate electrode 16, from the gate control circuit 19. As a result, the PN-junction between the P-type semiconductive region 6 and the N$^+$-type semiconductive region 7 is forwardly biased, while the PN-junction between the P-type semiconductive region 6 and the N-type semiconductive region 3 is reversely biased. Consequently, the whole gate voltage $V_G$ is applied to the PN-junction between the P-type semiconductive region 6 and the N-type semiconductive region 3, whereby a depletion layer 24 is formed adjacent to the PN-junction and so the lateral channel 8 is narrowed, extending between the N$^+$-type semiconductive region 4 as the source region and the N$^+$-type semiconductive region 5 as the drain region. Consequently, the resistance between the source region and the drain region is increased. The above-described operation is the same as that of the conventional FET.

FIG. 3B shows that the gate voltage $V_G$ is supplied till a time $t_o$. When the resistance $R_{SD}$ of the channel 8 is higher, the drain current $I_D$ is smaller, as shown in FIG. 3A and FIG. 3C.

When the gate voltage $V_G$ becomes zero or the gate electrode 16 and the source electrode 14 are short-circuited to each other, at the time $t_o$, the potential of the semiconductive region 6 becomes negative, so that the PN-junction between the N$^+$-type semiconductive region 7 and the P-type semiconductive region 6 is reversely biased. Consequently, electric charge is stored in the P-type semiconductive region 6 and a depletion layer 25 is widened adjacent to the PN-junction between the P-type semiconductive region 6 and the N$^+$-type semiconductive region 7. As a result, a charge $Q=CV_G$ is stored in the depletion layer 25. When the potential of the N$^+$-type semiconductive region 7 becomes zero, the charge is divided to a region between the P-type semiconductive region 6 and the N$^+$-type semiconductive region 7 and to another region between the P-type semiconductive region 6 and the N-type semiconductive region 3. In other words, an equivalent circuit as shown on FIG. 4 is formed between the N$^+$-type semiconductive region 7 and the N-type semiconductive region 3, in which condensers $C_1$ and $C_2$ are connected in series with each other. In a different view point, the condensers $C_1$ and $C_2$ are connected in parallel with each other between the P-type semiconductive region 6 and the earth. Therefore, the following relationships are obtained:

$$Q = Q_1 + Q_2 = C_1 V_x + C_2 V_x.$$

$$V_x = V_G \times \frac{C_1}{C_1 + C_2}$$

where $V_x$ is the reverse voltage: Since the depletion layer remains due to the reverse voltage $V_x$, the resistance $R_{SD}$ between the source region and the drain region does not rapidly decrease but remains higher. The reverse current flows through the PN-junction and the stored charge in progressively discharged. As soon as the gate voltage $V_G$ becomes zero, the stored charge is divided to both of the PN-junctions, as above described. Therefore, the resistance $R_{SD}$ between the source region and the drain region decreases stepwise first and thereafter it progressively decreases, as shown on FIG. 3C.

When holes as minority carriers are not injected into the N-type semiconductive region 3 from the P-type semiconductive region 9, the current $I_D$ and the resistance $R_{SD}$ between the source region and the drain region change relatively slowly as shown by curves a on FIG. 3A and FIG. 3C, respectively.

However, since a positive bias voltage is applied to the P-type semiconductive region 9 by the power source 23 according to this invention, holes are injected into the N-type semiconductive region 3 from the P-type semiconductive region 9. An emitter current $I_{ES}$ due to the holes flows through the N-type channel 8. When the N-type channel 8 is pinched off by the negative high gate voltage $V_G$, the emitter current $I_{ES}$ is intercepted by the depletion layer in the N-type channel 8, so that the resistance $R_{SD}$ remains higher. However, negative charge in the P-type semiconductive region 6 are recombined with holes, accordingly as the quantity of the holes reaching to the depletion layer 24 from the P-type semiconductive region 9 is increased, and therefore the depletion layer 24 is narrowed. Consequently, the resistance $R_{SD}$ of the N-type channel 8 is rapidly decreased. The drain current $I_D$ and the resistance $R_{SD}$ between the source region and the drain region change as shown by the curves b on FIG. 3A and FIG. 3C. They change little at the first and parabolicly as a whole. Accordingly as the stored charge is dissipated, the $I_D$ and $R_{SD}$ change rapidly and the time-constant becomes extremely small.

When a capacitance C of the P-type semiconductive region 6 is $10_pF$ and a gate voltage $V_G$ is 10V, an electrical charge $Q=10^{-10}$ coulombs is stored in the P-type semiconductive region 6. In that condition, an emitter current $I_{ES}$ of about 1 $\mu A$ may be required in order that the resistance $R_{SD}$ attains to a given resistance $R^2$ in about one millisecond. In FIG. 3A and FIG. 3C, the curves b and c are shown for $I_{ES} = 3$ $\mu A$ and $I_{ES} = 6$ $\mu A$, respectively.

In the charge storage junction type FET 1, when the emitter current $I_{ES}$ is supplied, the resistance $R_{SD}$ is maintained at the higher level for a given time and thereafter it is rapidly decreased to the given level. Moreover, the time when it attains to the given level can be varied with the emitter current $I_{ES}$. For example, the FET 1 can be applied to any pulse responce apparatus. When the emitter current, the resistance $R_{SD}$ is maintained at the higher level for a longer time.

Moreover, when any switching operation is performed at a given value $R_2$ of the resistance $R_{SD}$, a time-constant can be very easily determined since the resistance $R_{SD}$ decreases very rapidly near the time $t_1$ or $t_2$ when it attains to the given value $R_2$.

In this embodiment, a DC power source may be connected between the emitter electrode 18 and the drain electrode 15, to inject holes into the N-type semiconductive region 3. In that case, a bias voltage applied to the emitter electrode 18 is always constant since it is not related to the resistance of the N-type channel 8, and therefore a constant emitter current $I_{ED}$ flows. The resistance $R_{SD}$ changes with time, as shown by curves on FIG. 3D.

The gate capacitance C changes with the potential of the N$^+$-type semiconductive region 7 and the conductance varies with the potential, so that the stored charge Q varies. Consequently, the voltage $V_{DS}$ between the source region and the drain region is not exactly proportional to the stored charge Q. Accordingly, the resistance $R_{SD}$ does not linearly change with time. In FIG. 3D, curves $a'$, $b'$ and $c'$ show changes of the resistance $R_{SD}$ for the emitter current $I_{ED} = 0, 0.05$ μA and 0.1 μA, respectively. Time intervals $t_3 - t_0$, $t_2 - t_0$ and $t_1 - t_0$ are 3.5 sec., 1.75 sec. and 1.25 sec., respectively.

The case that a DC voltage is applied to the gate electrode 16, has been described. However, an AC voltage may be applied to the gate electrode 16 by the gate control circuit 19.

When a gate voltage $V_G$ as shown on FIG. 5A is applied to the gate electrode 16, the resistance $R_{SD}$ varies with time in a wave form corresponding to that of the gate voltage $V_G$, as shown by the dotted line on FIG. 5B, in the conventional FET having no charge storage effect, while the resistance $R_{SD}$ does not follow the gate voltage $V_G$ and it is retarded as shown by the solid line on FIG. 5B, in the FET 1 according to one embodiment of this invention. The retardation depends on the value of the emitter current $I_{ES}$. The retardation can be detected as a current or a voltage across the resistor 20, since the resistance $R_{SD}$ corresponds to the current between the source region and the drain region. Accordingly, the retardation can be detected by a DC component or an AC component of the voltage across the resistor 20. The larger the emitter current $I_{ES}$, the less the DC component, and the less the emitter current $I_{ES}$, the larger the DC component.

Next, another embodiment of the charge storage junction type FET according to this invention will be described with reference to FIG. 6 to FIG. 8.

Figure 7:
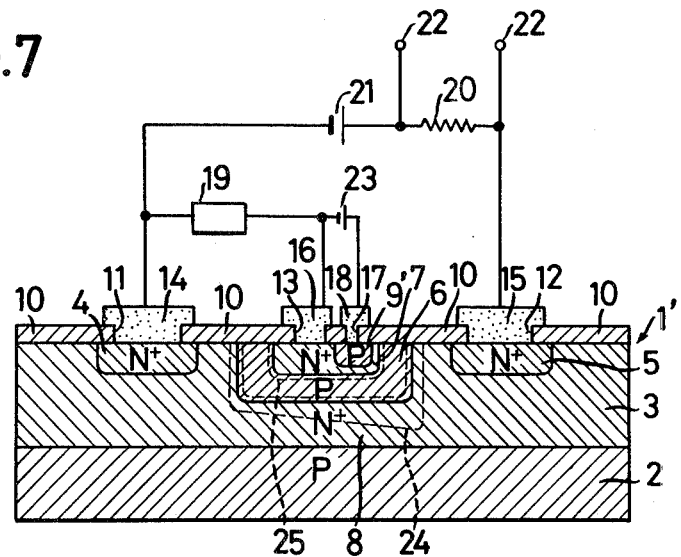
FIG. 7 is a cross sectional view taken along the line VII—VII of FIG. 6.
Figure 6:
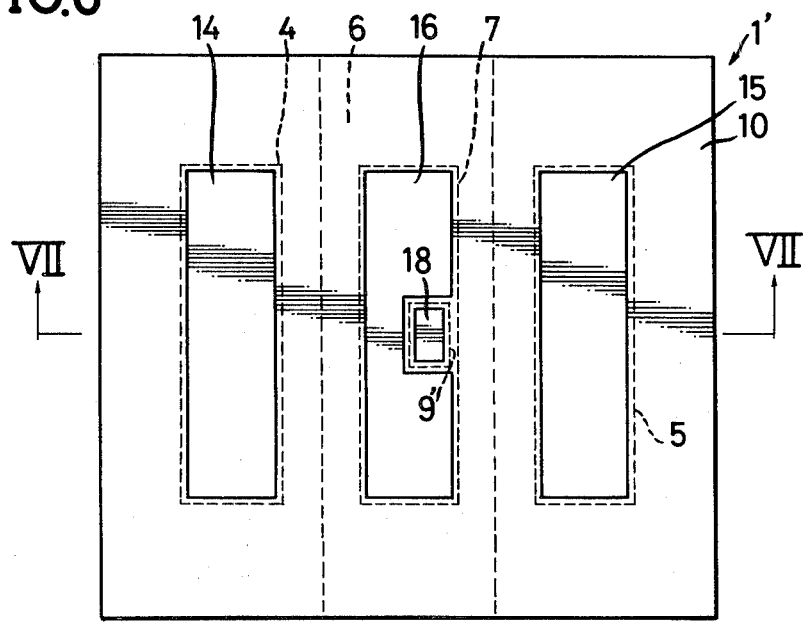
FIG. 6 is a plan view of a lateral charge storage junction type FET according to another embodiment of this invention.

In FIG. 6 to FIG. 8, the parts which correspond to the parts in the Figures illustrating the one embodiment are denoted by the like reference numerals or reference marks.

In this embodiment, a P-type semiconductive region 9' is formed in the N⁺-type semiconductive region 7 by the diffusion method. It functions as an emitter region to inject carriers. The insulating layer 10 of $SiO_2$ is formed on the N-type conductive region 3. An emitter electrode 18 closes an opening 17 formed on the insulating layer 10. A power source 23 is connected between the gate electrode 16 and the emitter electrode 18.

Next, operations of the charge storage junction type FET 1' according to the other embodiment of this invention will be described.

As in the first embodiment, when the gate voltage $V_G$ becomes zero, the charge stored in the P-type semiconductive region 6 is divided to a region between the P-type semiconductive region 6 and the N-type semiconductive region 3 and to another region between the P-type semiconductive region 6 and the N⁺-type semiconductive region 7. The reverse voltage $V_r$ is represented as the followings:

$$V_r = V_G \times \frac{C_1}{C_1 + C_2}$$

Since the depletion layer is formed due to the reverse voltage $V_r$, the resistance $R_{SD}$ between the source region and the drain region is maintained at the higher level for a certain time. However, the stored charge is progressively dissipated since the reverse current flows through the PN-junction. The resistance $R_{SD}$ decreases stepwise the instant the gate voltage $V_G$ becomes zero and thereafter it progressively decays (FIG. 8A, FIG. 8B and FIG. 8C).

When holes as minority carriers are not injected into the N-type semiconductive region 7 from the P-type semiconductive region 9', the current $I_D$ and the resistance $R_{SD}$ between the source region and the drain region change relatively slowly, as shown by curves a on FIG. 8A and FIG. 8C.

When a positive bias voltage is applied to the P-type semiconductive region 9' by the power source 23 and holes are injected into the N-type semiconductive region 7 from the P-type semiconductive region 7, the emitter current $I_{EG}$ flows toward the depletion layer 24 and negative charge stored in the P-type semiconductive region 6 is progressively neutralized into dissipation. The bias voltage is constant independently of the resistance of the N-type channel 8 and therefore the emitter current $I_{EG}$ is constant. The emitter current $I_{EG}$ the current $I_D$ and the resistance $R_{SD}$ change with time, as shown by curves b and c on FIG. 8A and FIG. 8C.

With respect to the relationship $Q = CV_G$, the gate capacitance C varies with the potential of the N⁺-type semiconductive region 7 and accordingly Q varies. Therefore, the voltage $V_{DS}$ between the source region and the drain region is not exactly proportional to Q. Consequently, the current $I_D$ and the resistance $R_{SD}$ do not linearly change, but they change as shown by the curves b and c on FIG. 8A and FIG. 8C. The curves $a$, $b$ and $c$ show the changes of the current $I_D$ or the resistance $R_{SD}$ for the emitter currents $I_{EG} = 0$, medium and large, respectively.

Also in the charge storage junction type FET 1' according to the second embodiment of this invention, the decay time of the resistance $R_{SD}$ varies with the emitter current $I_{EG}$. Any desired switching operation can be performed by the utilization of such a decay time.

Also in this embodiment, an AC voltage may be applied to the gate electrode 16 by the gate control circuit 19.

When the gate voltage $V_G$ as shown on FIG. 5A is applied to the gate electrode 16, the resistance $R_{SD}$ does not follow the gate voltage $V_G$, but it is retarded, as shown on FIG. 5B. The retardation depends on the emitter current $I_{EG}$. It can be detected by the AC component or DC component of the voltage across the resistor 20.

Although an illustrative embodiment of this invention has been described in detail herein with reference to the accompanying drawings, it is to be understood that the invention is not limited to that precise embodiment, and that various changes and modifications may be effected therein by one skilled in the art without departing from the scope or spirit of this invention, as defined in the appended claims.

For example, a conductivity type of a semiconductive region may be converted. The characteristics can be varied with modifications of the gate control. Of course, this invention can be suited for a vertical charge storage type FET. Moreover, the first embodiment may be combined with the second embodiment.

What is claimed is:

1. A planar semiconductor device comprising a semiconductor substrate of a first conductivity type, an epitaxial layer of opposite conductivity type overlying said substrate, a source region of opposite conductivity type and of an impurity concentration greater than said epitaxial layer formed in the surface of said epitaxial layer, a drain region of opposite conductivity type and of an impurity concentration greater than said epitaxial layer formed in the surface of said epitaxial layer and laterally offset from said source region, a first gate region of first conductivity type formed in said epitaxial layer between said source and drain regions, a second gate region of opposite conductivity type and of an impurity concentration greater than said epitaxial layer formed in said first gate region, a gate control circuit connected between said source region and said second gate region, a first potential source, a load resistor connected to said first potential source and the combination connected between said source and drain regions, output terminals connected to opposite ends of said load resistor, an emitter region of a first conductivity type formed in said epitaxial layer, and a second potential source connected to said emitter region.

2. A planar semiconductor device according to claim 1 wherein said emitter region is formed in said epitaxial region at a location which is not between said source and drain regions and said second potential source is connected between said source and said emitter region.

3. A planar semiconductor device according to claim 1 wherein said emitter region is formed in said second gate region and said second potential is connected between said emitter and said second gate region.

* * * * *